United States Patent
Ishida et al.

(10) Patent No.: US 6,711,084 B2
(45) Date of Patent: Mar. 23, 2004

(54) SEMICONDUCTOR DEVICE CAPABLE OF RELIABLE POWER-ON RESET

(75) Inventors: Takuya Ishida, Hyogo (JP); Jun Setogawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 28 days.

(21) Appl. No.: 10/205,435

(22) Filed: Jul. 26, 2002

(65) Prior Publication Data

US 2003/0142572 A1 Jul. 31, 2003

(30) Foreign Application Priority Data

Jan. 28, 2002 (JP) ........................................ 2002-018154

(51) Int. Cl.$^7$ ................................................ G11C 7/00
(52) U.S. Cl. ................... 365/226; 365/236; 365/189.09
(58) Field of Search ................................. 365/226, 236, 365/189.09, 194, 154

(56) References Cited

U.S. PATENT DOCUMENTS 5,703,804 A * 12/1997 Takata et al. ............... 365/145

FOREIGN PATENT DOCUMENTS

| JP | 1-41519 | 2/1989 |
| JP | 6-4181 | 1/1994 |

* cited by examiner

*Primary Examiner*—David Lam
(74) *Attorney, Agent, or Firm*—McDermott, Will & Emery

(57) ABSTRACT

The output of a ring oscillator that receives an internal power supply potential as an operating power supply potential to conduct an oscillation operation is counted by a counter that receives an external power supply potential as an operating power supply potential, and reset is canceled. The circuit that operates with an internal power supply potential can be reliably reset even when the rise of the internal power supply potential is delayed. By adjusting the number of stages of the inverter of a ring oscillator and the number of bits of the counter, the power-on reset time can be adjusted while suppressing increase of the area. An appropriate power-on reset signal can be generated to prevent erroneous operation even in the case where the rise of the internal power supply potential lags behind the rise of the external power supply potential.

8 Claims, 15 Drawing Sheets

SEMICONDUCTOR DEVICE CAPABLE OF RELIABLE POWER-ON RESET

BACKGROUND OF THE INVENTION

1. Field of the Invention

The present invention relates to semiconductor devices, and particularly to a semiconductor device embedded with a power-on reset circuit to initialize internal circuitry when power is turned on.

2. Description of the Background Art

Semiconductor memory devices such as a dynamic random access memory (DRAM) are provided with a power-on reset circuit to initialize the internal latch circuit to prevent erroneous operation at the time of power on.

FIG. 21 is a circuit diagram of a structure of a conventional typical power-on reset circuit 502.

Referring to FIG. 21, power-on reset circuit 502 includes a resistor 504 and a capacitor 506 connected in series between a node to which an external power supply potential extVcc is applied and a ground node, and an inverter 508 having its input connected to the connection node of resistor 504 and capacitor 506 to output a power-on reset signal POR. In FIG. 21, the potential of the connection node of resistor 504 and capacitor 506 is set to a potential VRC.

FIG. 22 is an operation waveform diagram to explain an operation of power-on reset circuit 502.

Referring to FIGS. 21 and 22, power supply potential extVcc begins to rise at time t0 when power is turned on. Since it takes some time to accumulate charge at the electrode of capacitor 506 due to the presence of resistor 504, the rise of potential VRC lags behind the rise of power supply potential extVcc.

The power supply potential is low during time t0 to t1, and the operation of inverter 508 is unstable.

The output of inverter 508 is stable during time t1–t2. Here, inverter 508 provides an output of an H level (logical high) since the level of potential VRC is lower than the level of a threshold voltage VTH of inverter 508. The H level rises as power supply potential extVcc rises. Other internal circuits are reset by a power-on reset signal POR of this level output during time t1–t2. The period of time of t1–t2 is a reset period TRST.

When the level of potential VRC exceeds the level of threshold voltage VTH at time t2, inverter 508 provides an output of an L level (logical low). Therefore, a power-on reset signal POR attains an L level, whereby the reset with respect to internal circuitry is cancelled.

In practice, the internal circuitry in semiconductor devices, particularly in semiconductor memory devices, does not directly receive an external power supply potential to operate. For the purpose of increasing the speed and reducing power consumption, an appropriate internal power supply potential for each of a plurality of embedded internal circuits is generated. The internal circuits receive respective internal power supply potentials to operate. The internal power supply generation circuit generating such internal power supply potential has a large capacitor at the output node to stabilize the internal power supply potential.

Therefore, the rise of the internal power supply potential will lag behind the rise of the external power supply potential. As a result, there is a possibility of the output of the power-on reset circuit being inverted prior to the rise of the internal power supply potential to cancel the power on reset, whereby the internal circuitry may not be initialized sufficiently.

The conventional power-on reset circuit 502 requires an extremely large resistor and capacitor. If a plurality of power-on reset circuits are provided corresponding to each internal power supply potential, the chip area will be increased corresponding to the increase of the power-on reset circuit.

SUMMARY OF THE INVENTION

An object of the present invention is to provide a semiconductor device embedded with a power-on reset circuit that operates reliably in response to activation of an internal power supply potential generated in the semiconductor device, and of a small area to realize circuitry.

According to an aspect of the present invention, a semiconductor device includes a first power supply circuit, and a first power-on reset circuit.

The first power supply circuit receives an external power supply potential to generate a first internal power supply potential. The first power-on reset circuit outputs a first reset signal in response to activation of the first internal power supply potential.

The first power-on reset circuit includes a first oscillation circuit, and a first count circuit. The first oscillation circuit oscillates in response to activation of the first internal power supply potential. The first count circuit receives the external power supply potential as an operating power supply potential to count in response to an output of the first oscillation circuit, and causes the first reset signal to make a transition from a reset status to a reset cancel status when the count value reaches a predetermined value.

Since the oscillation circuit oscillates according to the internal power supply potential and the oscillation is counted by the count circuit for generation of a reset signal, the main advantage of the present invention is that an appropriate reset signal can be generated even in the case where the rise of an internal power supply potential is delayed with respect to an external power supply potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
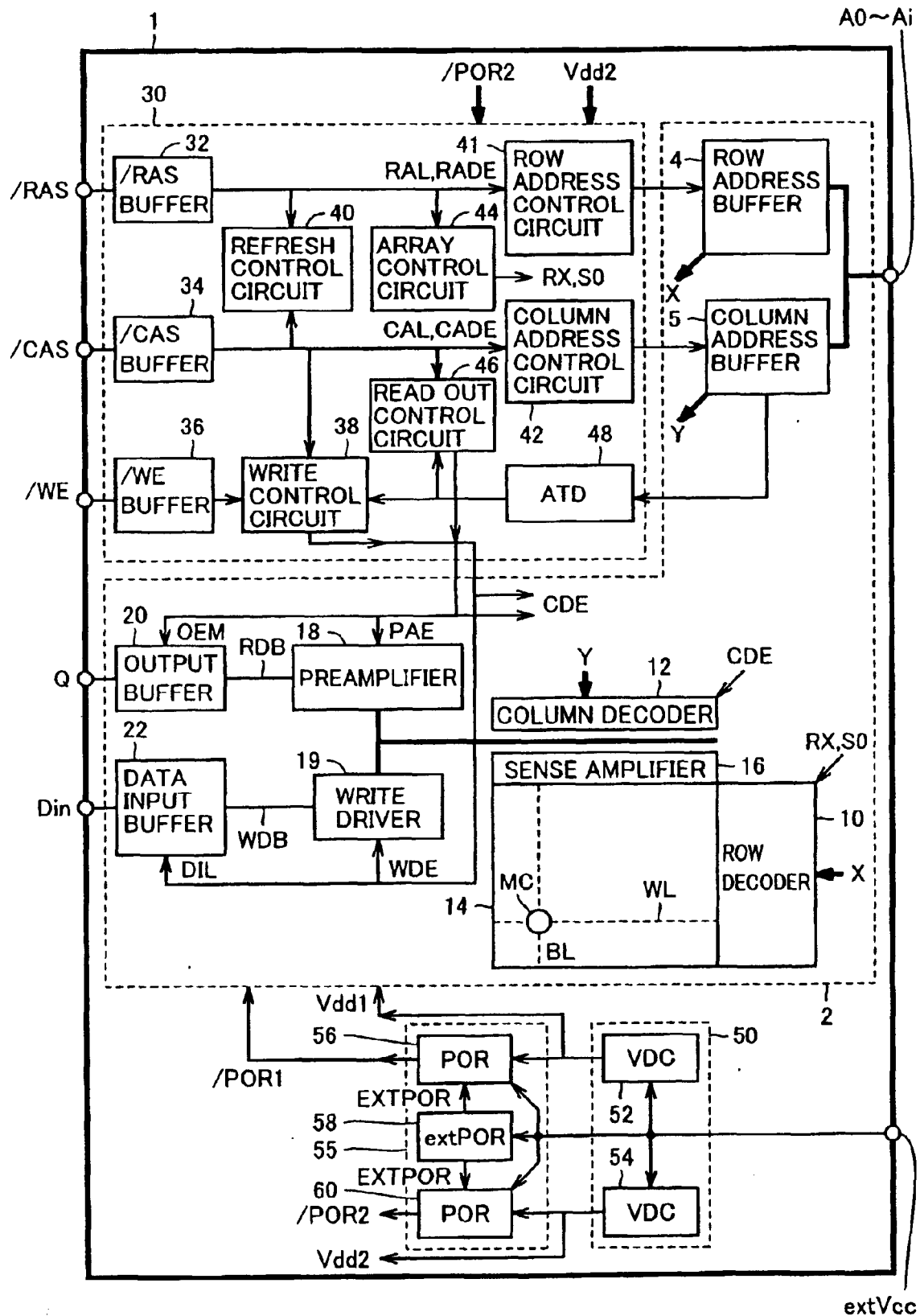
FIG. 1 is a schematic block diagram of a structure of a semiconductor device 1 according to a first embodiment of the present invention.

Embodiments of the present invention will be described in detail hereinafter with reference to the drawings.

In the drawings, the same reference characters denote the same or corresponding components.

First Embodiment

FIG. 1 is a schematic block diagram of a structure of a semiconductor device 1 according to a first embodiment of the present invention. A dynamic random access memory (DRAM) will be taken as a specific example of semiconductor device 1.

Referring to FIG. 1, semiconductor device 1 includes internal circuitry 2 writing input data Din to a region addressed by an externally applied address signal and reading out data stored in a region specified by address signals A0–Ai to output a data output signal Q, internal circuitry 30 providing control of the operation timing of internal circuitry 2 according to control signals /RAS, /CAS and /WE, an internal power supply generation circuit 50 receiving an externally applied external power supply potential extVcc to output internal power supply potentials Vdd1 and Vdd2, and a reset signal generation circuit 55 providing reset signals /POR1 and /POR2 to internal circuitry 2 and 30, respectively, according to external power supply potential extVcc and internal power supply potentials Vdd1 and Vdd2.

Internal power supply generation circuit 50 includes a voltage-down converter (VDC) 52 receiving external power supply potential extVcc to output internal power supply potential Vdd1, and a voltage-down converter 54 receiving external power supply potential extVcc to output internal power supply potential Vdd2. Internal power supply potential Vdd1 is supplied to internal circuitry 2 whereas internal power supply potential Vdd2 is supplied to internal circuitry 30.

Reset signal generation circuit 55 includes an external power-on reset circuit 58 providing a power-on reset signal EXTPOR according to external power supply potential extVcc, a power-on reset circuit 56 initialized in response to power-on reset signal EXTPOR to output a power-on reset signal /POR1 according to internal power supply potential Vdd1, and a power-on reset circuit 60 initialized in response to power-on reset signal EXTPOR to output a power-on reset signal /POR2 according to internal power supply potential Vdd2.

Internal circuitry 2 includes a memory cell array 14 having a plurality of memory cells arranged in a matrix, a row address buffer 4 and a column address buffer 6 receiving externally applied address signals A0–Ai.

In memory cell array 14, one word line WL corresponding to a row of memory cells, one bit line BL corresponding to a column of memory cells, and one memory cell MC provided corresponding to the crossing of word line WL and bit line BL are shown representatively.

Internal circuitry 2 further includes a row decoder 10 identifying a row in memory cell array 14 according to an address signal X output from row address buffer 4 and control signals RX and SO, a column decoder 12 identifying a column in memory cell array 14 according to an address signal Y output from column address buffer 4 and a control signal CDE, and a sense amplifier 16 amplifying the data on bit line BL from memory cell MC.

Internal circuitry 2 further includes a data input buffer 22 receiving data input signal Din according to a control signal DIL, a write data bus WDB receiving write data from data input buffer 22, and a write driver 19 providing write data transmitted through write data bus WDB to an input/output line I/O according to a control signal WDE.

Internal circuitry 2 further includes a preamplifier 18 amplifying data read out onto input/output line I/O by sense amplifier 16 according to a control signal PAE, a read data bus RDB receiving data read out from preamplifier 18, and an output buffer 20 providing the read out data transmitted through read data bus RDB as a data output signal Q according to a control signal OEM.

Internal circuitry 30 includes a /RAS buffer 32, a /CAS buffer 34 and a /WE buffer 36 receiving control signals /RAS, /CAS and /WE, respectively, a refresh control circuit 40 providing control of a refresh operation according to outputs of /RAS buffer 32 and /CAS buffer 34, and an ATD circuit 48 detecting transition of an address signal output from column address buffer 5.

Control signals RAL and RADE are output from /RAS buffer 32. Control signal RAL is a row address latch signal to latch a row address signal in a row address buffer. Control signal RADE is a row address enable signal to render the row decoder active.

Control signals CAL and CADE are output from /CAS buffer 34. Control signal CAL is a column address latch signal to latch a column address signal at a column address buffer. Control signal CADE is a column address enable signal to render the column decoder active.

Internal circuitry 30 further includes an array control circuit 44 receiving control signal RADE from /RAS buffer 32 to output control signals RX and SO, and a row address control circuit 41 receiving control signal RAL from /RAS buffer 32 to output a control signal to row address buffer 4.

Internal circuitry 30 further includes a read out control circuit 46 providing control signals OEM, PAE and CDE according to the output from ATD circuit 48 and control signal CADE from /CAS buffer 34, and a write control circuit 38 providing control signals DIL, WDE and CDE according to an output of /WE buffer 36.

The operation will be described briefly here. Data is stored in a memory array of N (=n×m) bits. The address information to be read out or written is transmitted to row address buffer 4 and column address buffer 5. Row decoder 10 selectively drives a certain word line WL, whereby information in the memory cells of m bits connected to the selectively-driven word line is transmitted to sense amplifier 16 via a bit line.

Then, column decoder 12 selects a certain bit line BL. Therefore, one sense amplifier unit is coupled to an input/output circuit via an input/output line I/O, and writing and reading are executed according to an instruction from write control circuit 38 and read out control circuit 46.

For the sake of reducing power consumption of a semiconductor memory device and ensure the reliability of a transistor, the trend is to reduce the operating voltage of the memory array unit. There is now a strong demand for the transistor driving potential in the chip to be decreased to a lower power supply potential with respect to an externally applied power supply potential extVcc.

The circuit that generates stable internal power supply potentials Vdd1 and Vdd2 to ensure reliability in the chip is a voltage-down converter (VDC). Semiconductor device 1 of FIG. 1 includes individual voltage down converters, i.e., a VDC 52 for the array circuit system (internal circuitry 2) and a VDC 54 for the peripheral circuit system (internal circuitry 30). By generating different voltages from these VDCs, the circuitry can be operated at respective voltages appropriate for the two internal circuitry.

Power-on reset circuit 56 outputs a reset signal to initialize the latch circuit in the internal circuitry for the purpose of preventing erroneous operation at the time of power on.

Figure 2:
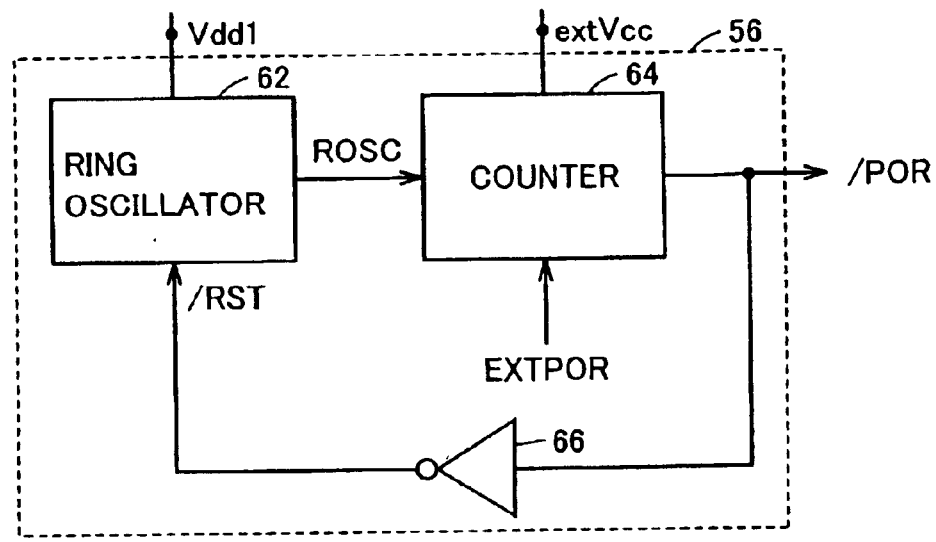
FIG. 2 is a circuit diagram of a structure of a power-on reset circuit 56 in FIG. 1.

FIG. 2 is a circuit diagram of a structure of power-on reset circuit 56 of FIG. 1.

Referring to FIG. 2, power-on reset circuit 56 includes a ring oscillator 62 receiving internal power supply potential Vddl as an operating power supply potential to perform an oscillation operation, and a counter 64 receiving external power supply potential extVcc as an operating power supply potential to count a signal ROSC output from ring oscillator 62. Counter 64 is initialized in response to a signal EXTPOR output from external power-on reset circuit 58 shown in FIG. 1, and performs a count operation in response to a change of signal ROSC output from ring oscillator 62 after the initialization is cancelled. When the count value reaches a predetermined value, power-on reset signal /POR is rendered inactive to an H level from an L level. The reset of the internal circuitry is cancelled by this inactivation.

Power-on reset circuit 56 further includes an inverter 66 receiving and inverting power-on reset signal /POR to output a reset signal /RST. Inverter 66 operates as an oscillation inhibit control circuit that renders oscillation reset signal /RST inactive and active in response to signal EXTPOR output from external power-on reset circuit 58 and power-on reset signal /POR, respectively. As such an oscillation inhibit control circuit, a latch circuit that similarly renders oscillation reset signal /RST inactive and active in response to signal EXTPOR and power-on reset signal /POR, respectively, may be used.

When power-on reset signal /POR attains an H level and the reset is cancelled, reset signal /RST is rendered active by inverter 66, whereby ring oscillator 62 is inhibited of oscillation. Unnecessary power consumption can be reduced since the oscillation circuit is inhibited of oscillation at the elapse of the required reset time.

Figure 3:
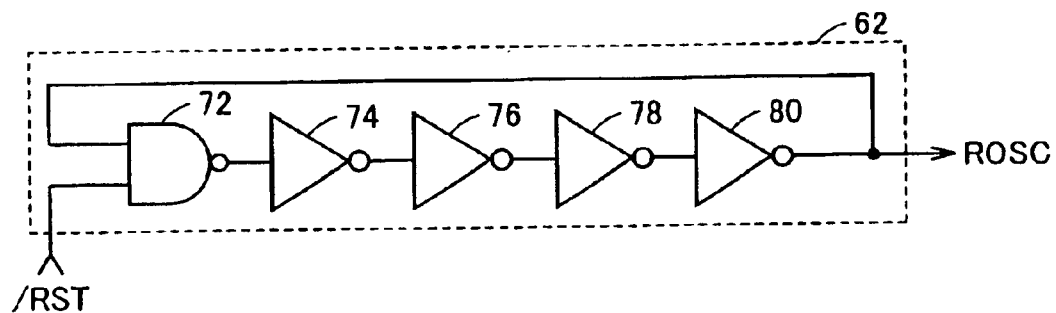
FIG. 3 is a circuit diagram of a structure of a ring oscillator 62 in FIG. 2.

FIG. 3 is a circuit diagram of a structure of ring oscillator 62 of FIG. 2.

Ring oscillator 62 includes a NAND circuit 72 receiving reset signal /RST at one input, and four inverters 74–80 connected in series, receiving the output of NAND circuit 72. Inverter 80 outputs a signal ROSC that is also supplied to the other input of NAND circuit 72.

A ring oscillator is generally configured by feeding back the output of a chain of odd-numbered stages of inverters to the input. It is to be noted that FIG. 3 corresponds to a structure that can reduce power consumption by suppressing oscillation of the ring oscillator after power-on reset has been cancelled. Specifically, NAND circuit 72 is employed instead of the first stage of inverter in the inverter chain.

Figure 4:
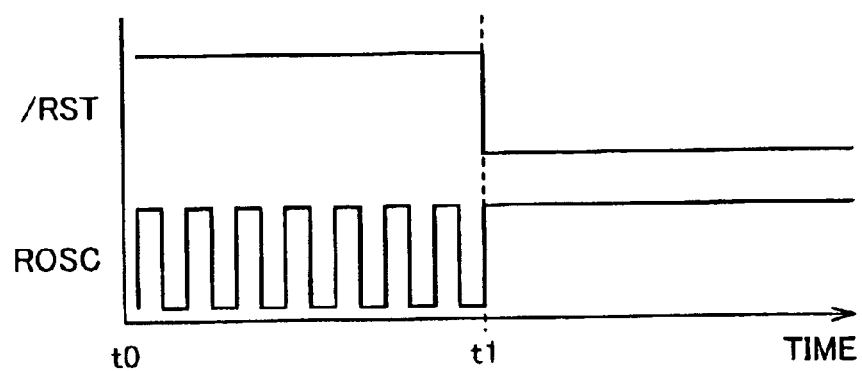
FIG. 4 is an operation waveform diagram to explain an operation of ring oscillator 62 in FIG. 3.

FIG. 4 is an operation waveform diagram to explain the operation of ring oscillator 62 of FIG. 3.

Referring to FIGS. 3 and 4, NAND circuit 72 operates as an inverter that inverts the output of inverter 80 when reset signal /RST is at an H level at time t0–t1. Therefore, ring oscillator 62 conducts an oscillation operation.

When reset signal /RST is driven to an L level after time t1, NAND circuit 72 has its output fixed to an H level. Therefore, ring oscillator 62 is inhibited of oscillation.

Figure 5:
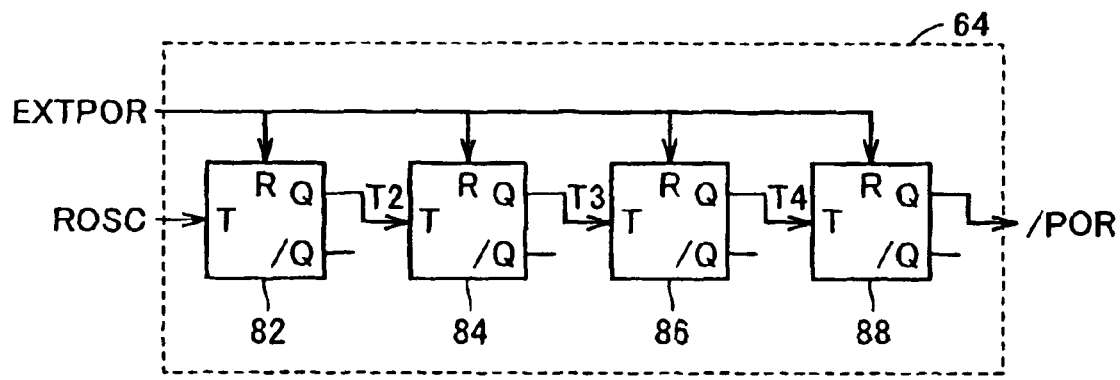
FIG. 5 is a circuit diagram showing an example of a structure of a counter 64 in FIG. 2.

FIG. 5 is a circuit diagram showing one example of a structure of counter 64 of FIG. 2.

Referring to FIG. 5, counter 64 includes four T flip-flops 82–88 connected in series. T flip-flops 82–88 invert the signal of the Q output in response to the falling edge of the signal applied to the T input.

T flip-flops 82–88 are initialized by signal EXTPOR output from external power-on reset circuit 58 of FIG. 1.

T flip-flop 82 receives signal ROSC from ring oscillator 62 of FIG. 2 at its T input node. T flip-flop 84 receives a signal T2 applied from the Q output of T flip-flop 82 at its T input. T flip-flop 86 receives a signal T3 applied from the Q output of T flip-flop 84 at its T input. T flip-flop 88 receives a signal T4 applied from the Q output of T flip-flop 86 at its T input.

Counter 64 can count in binary the number of pulses generated in signal ROSC . The number of bits of the counter can be altered by the number of flip-flops connected in series.

Figure 6:
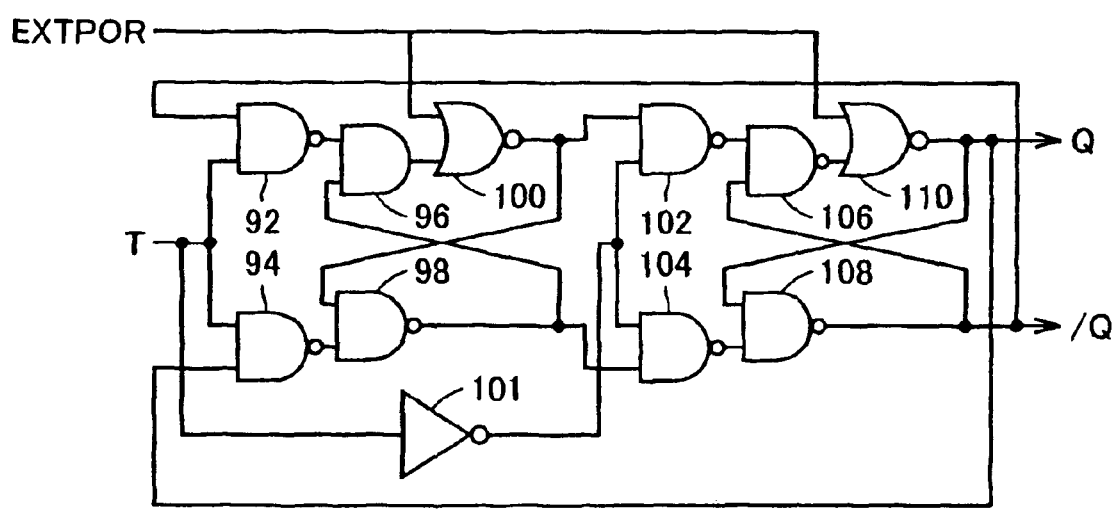
FIG. 6 is a circuit diagram of a structure of a T flip-flop 82 in FIG. 5.

FIG. 6 is a circuit diagram of a structure of T flip-flop 82 of FIG. 5.

Referring to FIG. 6, T flip-flop 82 includes an inverter 101 receiving and inverting an input signal T, a NAND circuit 92 receiving an input signal T and an output signal /Q, a NAND circuit 94 receiving input signal T and an output signal Q, an AND circuit 96 receiving the output of NAND circuit 92 at one input, a NOR circuit 100 receiving the output of AND circuit 96 and reset signal EXTPOR, and a NAND circuit 98 receiving the outputs of NOR circuit 100 and NAND circuit 94. The output of NAND circuit 98 is supplied to the other input of AND circuit 96.

T flip-flop 82 further includes a NAND circuit 102 receiving the outputs of inverter 101 and NOR circuit 100, a NAND circuit 104 receiving the outputs of inverter 101 and NAND circuit 98, a NAND circuit 106 receiving the output of NAND circuit 102 and signal /Q, a NOR circuit 110 receiving the output of NAND circuit 106 and reset signal EXTPOR to output signal Q, and a NAND circuit 108 receiving signal Q and the output of NAND circuit 104 to output signal /Q.

The remaining T flip-flops 84–88 each have a structure similar to that of T flip-flop 82. Therefore, description thereof will not be repeated.

Figure 7:
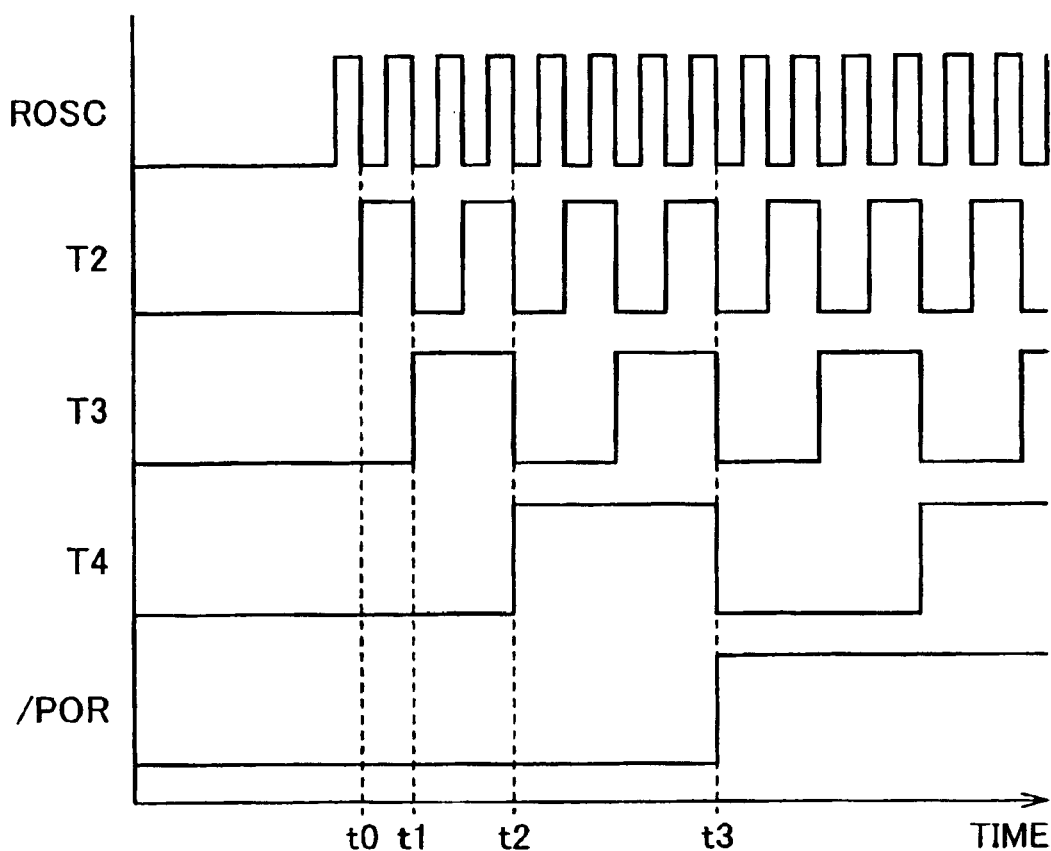
FIG. 7 is an operation waveform diagram to explain an operation of counter 64 in FIG. 5.

FIG. 7 is an operation waveform diagram to explain an operation of counter 64 of FIG. 5.

Referring to FIGS. 5 and 7, the fall of signal ROSC to an L level from an H level at time t0 after reset signal EXTPOR is cancelled to an L level causes the output of T flip-flop 82 to be inverted. In response, signal T2 is pulled up to an H level from an L level.

When signal ROSC is pulled down again to an L level from an H level at time t1, T flip-flop 82 has its output inverted again. As a result, signal T2 is pulled down to an L level from an H level. In response, T flip-flop 84 has its output inverted. Therefore, signal T3 is pulled up to an H level from an L level.

When signal T2 is pulled down again to an L level from an H level at time t2, T flip-flop 84 has its output inverted. Therefore, signal T3 is driven to an L level from an H level. In response, T flip-flop 86 has its output inverted. As a result, signal T4 is pulled up to an H level from an L level.

When signal T3 is pulled down to an L level from an H level at time t3, T flip-flop 86 has its output inverted again. As a result, signal T4 is pulled down to an L level from an H level. In response, the output of T flip-flop 88 is inverted, whereby power-on reset signal /POR is driven to an H level from an L level. The reset cancelled status is maintained at time t3 and et seq.

Figure 8:
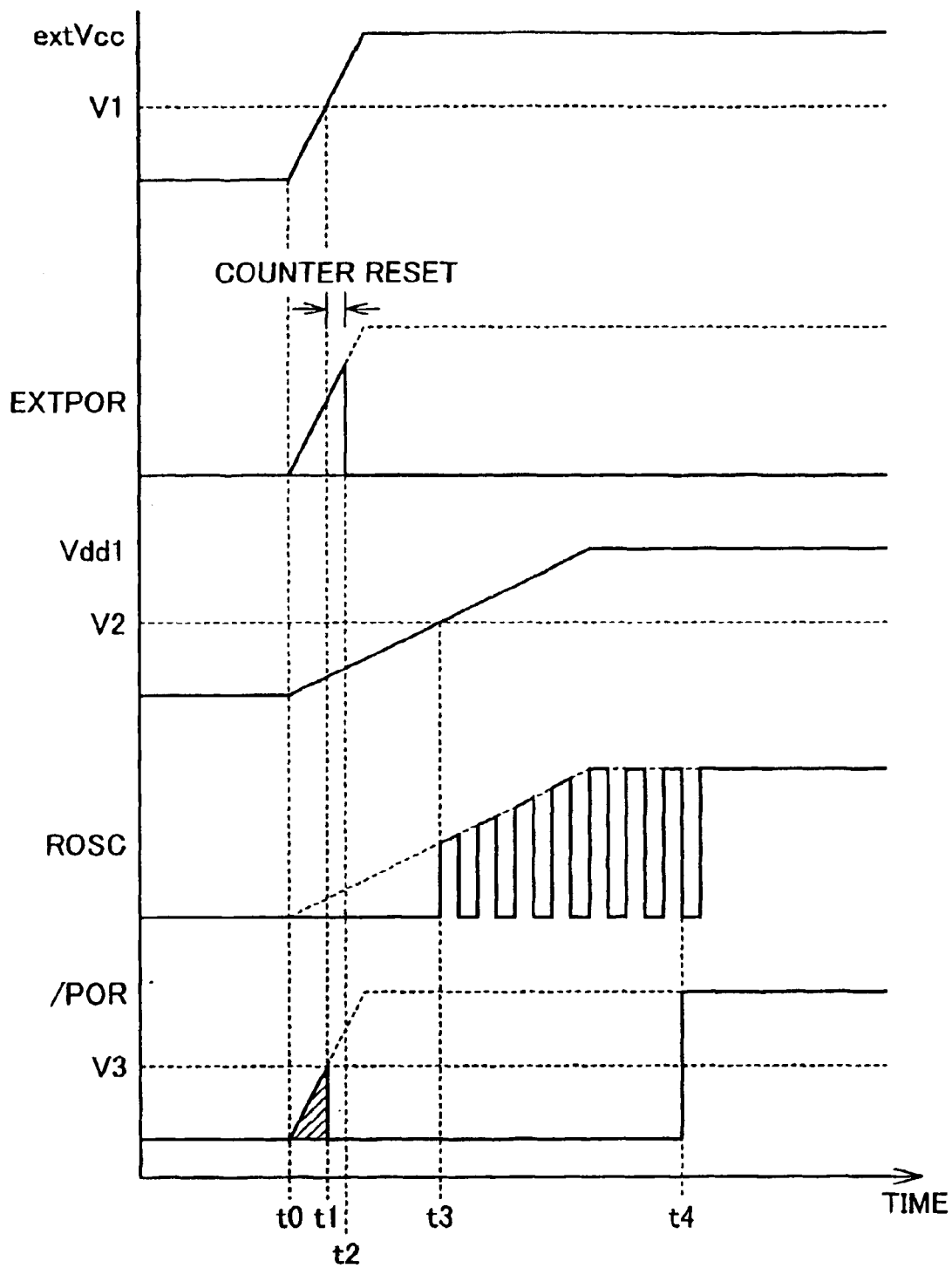
FIG. 8 is an operation waveform diagram to explain an operation of a power-on reset circuit 56 of the first embodiment.

FIG. 8 is an operation waveform diagram to explain the operation of power-on reset circuit 56 of the first embodiment.

Referring to FIGS. 2 and 8, external power supply potential extVcc begins to rise at time t0. Accordingly, counter 64 that receives this external power supply potential as an operating power supply potential attains an operable status.

At time t1–t2, the T flip-flops in counter 64 are initialized by reset signal EXTPOR output according to external power supply potential extVcc. Internal power supply potential Vdd1 rises slightly after the rise of external power supply potential extVcc. When internal power supply potential Vdd1 is equal to or lower than a predetermined threshold value V2, ring oscillator 62 that receives internal power supply potential Vdd1 to operate does not yet initiate its oscillation.

When internal power supply potential Vdd1 exceeds the level of threshold value V2 at time t3, ring oscillator 62 commences an oscillation operation. Counter 64 counts the number of pulses generated in oscillation signal ROSC.

When the count value reaches a predetermined value at time t4, the predetermined bit of counter 64 is altered to 1 from 0. In response to this change in bit, power-on reset signal /POR is driven to an H level from an L level, whereby reset of the internal circuitry is cancelled.

By feeding back this power-on reset signal /POR to the input of ring oscillator 62 via inverter 66, ring oscillator 62 is inhibited of oscillation. Since counter 64 does not conduct a count operation thereafter, power-on reset signal /POR will not change thereafter. Therefore, reset will not be effected again during the rise of the power.

By having ring oscillator 62 operate with an internal power supply potential and counter 64 operate with an external power supply potential as described above, ring oscillator 62 will not oscillate until the internal power supply potential rises even if the external power supply potential rises. Therefore, the problem of the power-on reset being cancelled prior to the rise of the internal power supply potential can be solved.

Figure 21:
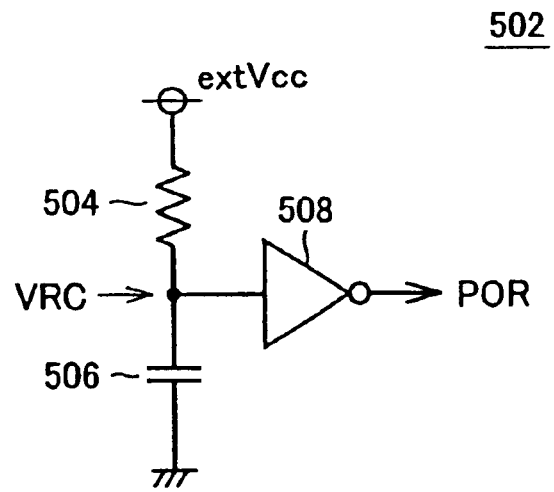
FIG. 21 is a circuit diagram of a structure of a conventional typical power-on reset circuit 502.
Figure 22:
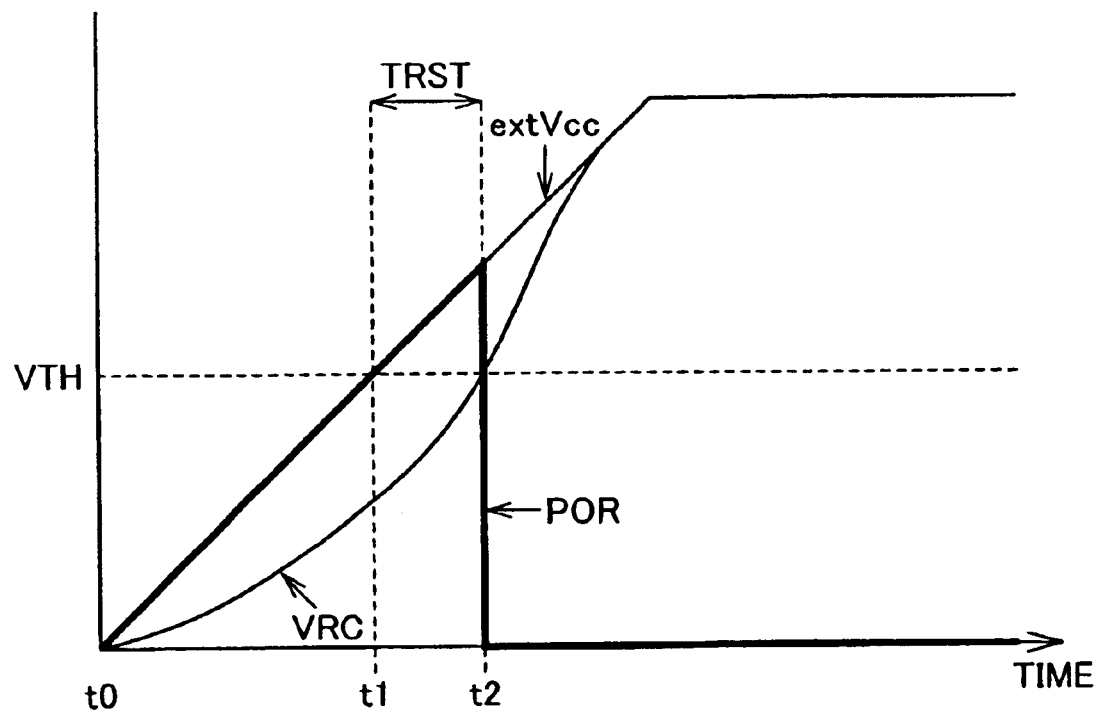
FIG. 22 is an operation waveform diagram to explain an operation of power-on reset circuit 502.

Since the conventional power-on reset circuit shown in FIG. 21 is employed for the initialization of counter 64, initialization of the counter per se is ensured. Erroneous operation of the power-on reset circuit per se when power is turned on can be eliminated.

Since the pulse width of oscillation can be altered by changing the number of stages of the inverters included in the ring oscillator, the period of time up until power-on reset is cancelled can be altered arbitrarily. Furthermore, since the predetermined count value to power-on reset cancelled can be varied by altering the bit number of the counter, the period of time up until power-on reset is cancelled can be likewise altered arbitrarily.

Since the power-on reset circuit in the present invention is configured basically only by inverters and NAND circuits, as compared to the conventional case where a plurality of power-on reset circuits as shown in FIG. 21 employing conventional resistors and capacitive elements are employed, increase of the circuit area can be suppressed.

Second Embodiment

The semiconductor device according to a second embodiment of the present invention includes a power-on reset circuit 200 instead of power-on reset circuit 56 in the structure of the semiconductor device shown in FIG. 1.

Figure 9:
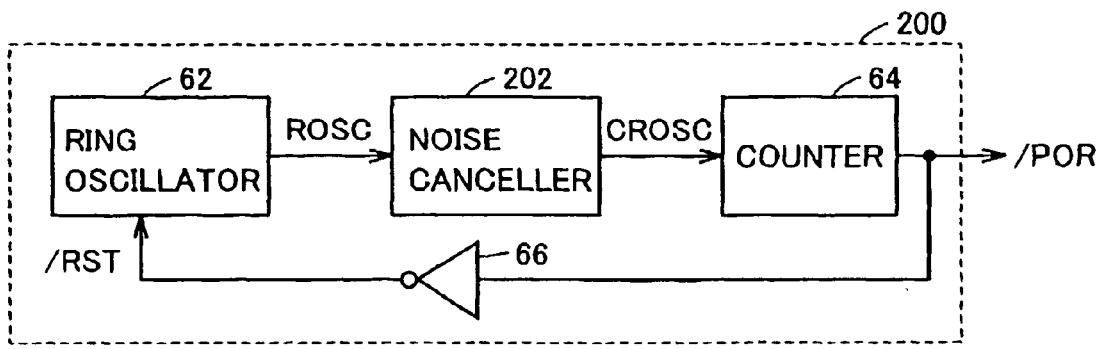
FIG. 9 is a circuit diagram of a structure of a power-on reset circuit 200.

FIG. 9 is a circuit diagram of a structure of power-on reset circuit 200.

Referring to FIG. 9, power-on reset circuit 200 has a structure similar to that of power-on reset circuit 56 shown in FIG. 2, provided that a noise canceller 202 is further included. Noise canceller 202 receives signal ROSC output from ring oscillator 62 to reduce noise, and applies a signal CROSC to counter 64. The remaining components in power-on reset circuit 200 are similar to those of power-on reset circuit 56. Therefore description thereof will not be repeated here.

Figure 10:
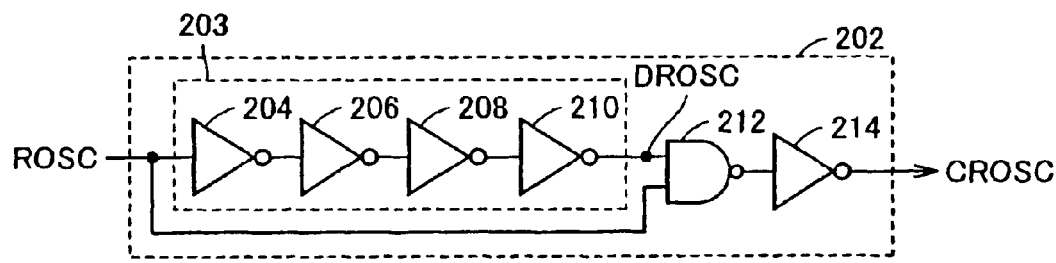
FIG. 10 is a circuit diagram of a structure of a noise canceller 202.

FIG. 10 is a circuit diagram of a structure of noise canceller 202. Referring to FIG. 10, noise canceller 202 includes a delay circuit 203 receiving signal ROSC, a NAND circuit 212 receiving an output signal DROSC of delay circuit 203 and signal ROSC, and an inverter 214 receiving and inverting the output of NAND circuit 212 to output signal CROSC.

Delay circuit 203 includes four stages of inverters 204–210 connected in series. Delay circuit 203 is not limited to 4 stages of inverters, and may be an even number of stages of inverters connected in series. The width of the noise pulse to be erased can be varied by adjusting the number of stages of these inverters.

Figure 11:
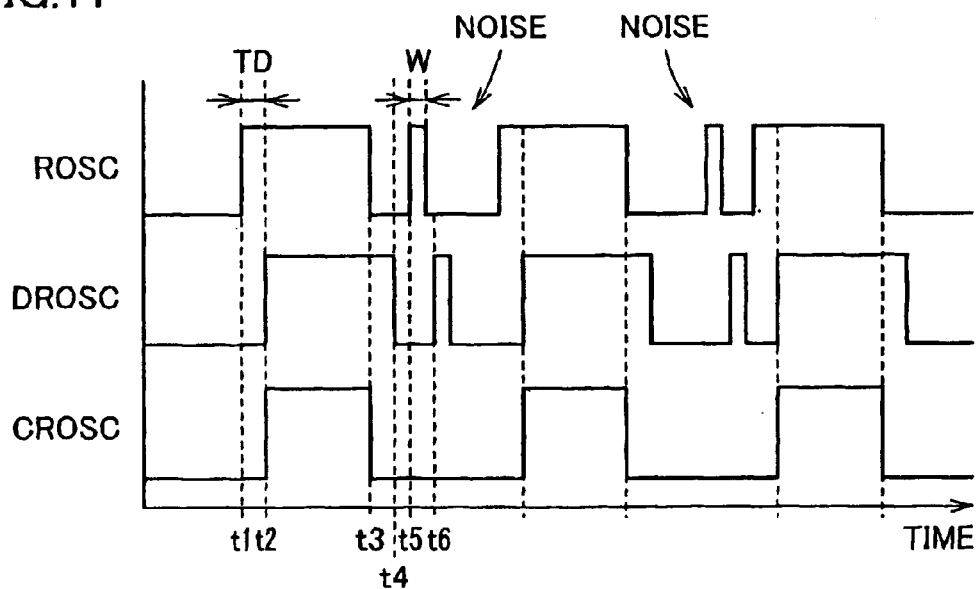
FIG. 11 is an operation waveform diagram to explain an operation of noise canceller 202 in FIG. 10.

FIG. 11 is an operation waveform diagram to explain an operation of noise canceller 202 of FIG. 10.

Referring to FIGS. 10 and 11, signal ROSC is driven to an H level from an L level at time t1. This rise appears as the rise of signal DROSC at time t2 corresponding to a delay time TD of delay circuit 203.

The fall of signal ROSC at time t3 appears as a fall of signal DROSC at time t4 corresponding to the elapse of the same delay time TD. Therefore, at time t2–t3, the output of NAND circuit 212 attains an L level, and signal CROSC that is an inverted signal thereof attains an H level. The signal has a pulse width that is narrower than the former pulse width by TD.

It is assumed that a noise pulse of width W is generated in signal ROSC at time t5. This pulse appears as a delayed signal DROSC with the same delay time TD. If width W is smaller than this TD, no overlapping will occur between the pulse of signal ROSC and signal DROSC. Since the output of NAND circuit 212 does not attain an L level, signal CROSC that is an inverted signal thereof maintains the L level. In other words, when noise with a pulse width W smaller than delay time TD is generated in signal ROSC, the noise is erased.

Thus, the usage of noise canceller 202 allows removal of fine pulsive noise. When power is turned on, many noises are generated since the ring oscillator is particularly unstable. These noises can be canceled by employing noise canceller 202. Thus, the problem of the reset being canceled prematurely to result in erroneous operation caused by the noise being counted to disallow a predetermined reset time can be prevented.

Third Embodiment

In the previous first embodiment, a counter having T flip-flops connected in series is employed. Since the selection of a delay time is set to a multiple of $2^n$, the reset period can be adjusted only roughly. There may be the case where a longer reset period than needed is set to take some time for the actuation of the internal circuitry.

By employing a ring counter as the counter, an arbitrary number of pulses of the output signal from the oscillator can be counted to determine a reset period by adjusting the number of stages of the shift register. However, too large an area will be required if the count is entirely carried out by the shift register.

Figure 12:
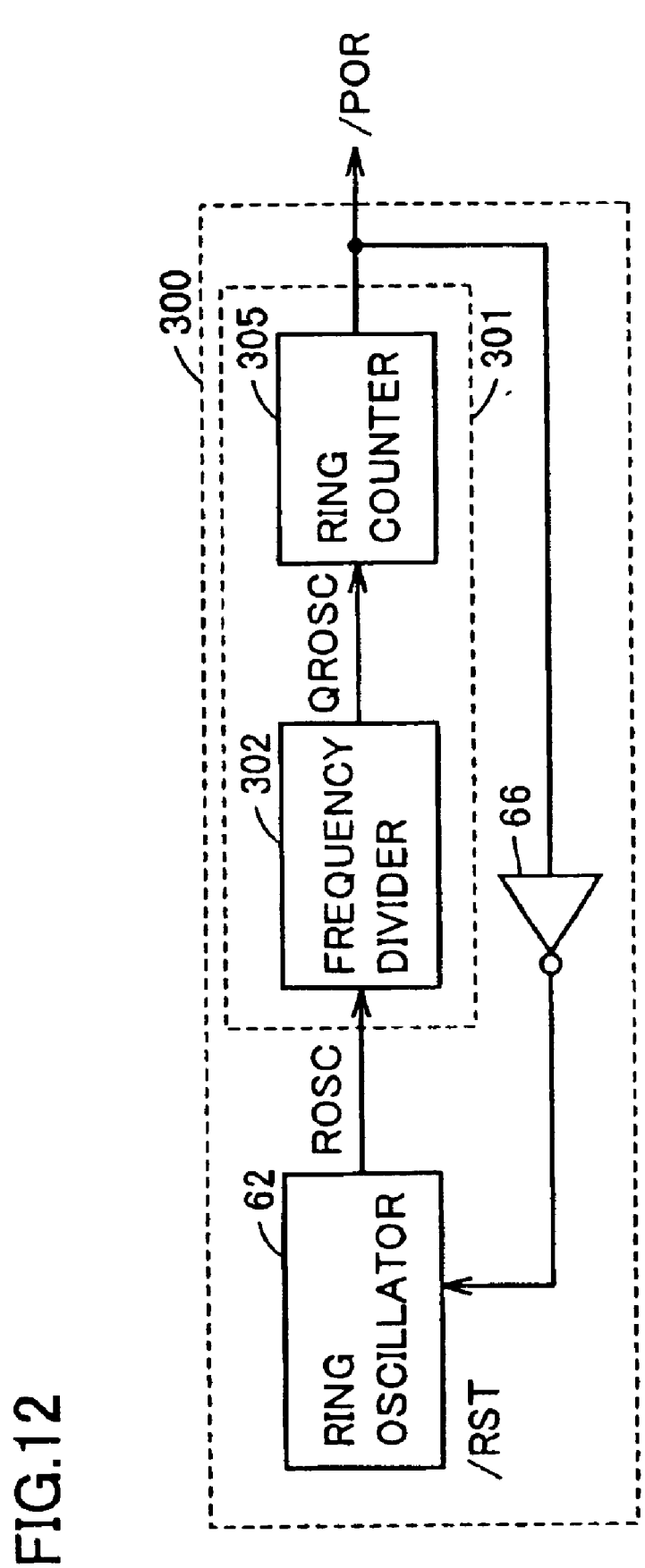
FIG. 12 is a circuit diagram of a structure of a power-on reset circuit 300 according to a third embodiment of the present invention.

FIG. 12 is a circuit diagram of a structure of a power-on reset circuit 300 according to a third embodiment of the present invention.

Referring to FIG. 12, power-on reset circuit 300 has a structure similar to that of a power-on reset circuit 56 of FIG. 2, provided that a counter 301 is included instead of counter 64.

Counter 301 includes a frequency divider 302 receiving and dividing signal ROSC, and a ring counter 305 receiving signal ROSC output from frequency divider 302 to perform a count operation, and output a power-on reset signal /POR.

Figure 13:
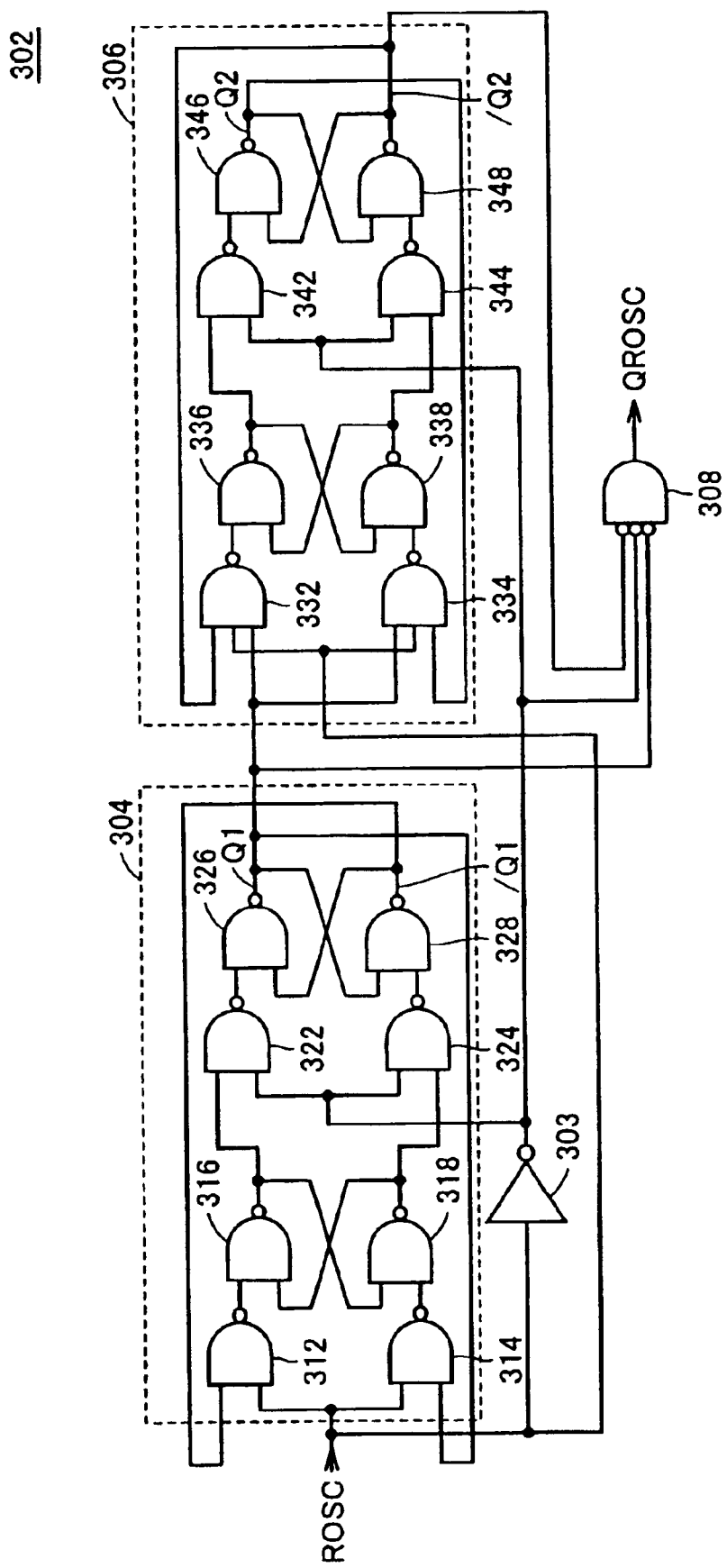
FIG. 13 is a circuit diagram of a structure of a frequency divider 302.

FIG. 13 is a circuit diagram of a structure of frequency divider 302.

Referring to FIG. 13, frequency divider 302 includes an inverter 303 receiving and inverting signal ROSC, a frequency divider 304 providing a signal Q1 output having a frequency that is ½ the frequency of signal ROSC, a frequency divider 306 conducting a frequency-dividing operation according to signals Q1 and ROSC to output a signal /Q2, and a 3-input NOR circuit 308 receiving signals Q1 and /Q2 and the output of inverter 303 to output signal QROSC.

Frequency divider 304 includes a NAND circuit 312 receiving signals /Q1 and ROSC, a NAND circuit 314 receiving signals Q1 and ROSC, a NAND circuit 316 receiving the output of NAND circuit 312 at one input, and a NAND circuit 318 receiving the outputs of NAND circuits 316 and 314. The output of NAND circuit 318 is applied to the other input of NAND circuit 316.

Frequency divider 304 further includes a NAND circuit 322 receiving the outputs of inverter 303 and NAND circuit 316, a NAND circuit 324 receiving the outputs of inverter 303 and NAND circuit 318, a NAND circuit 326 receiving signal /Q1 and the output of NAND circuit 322 to output signal Q1, and a NAND circuit 328 receiving signal Q1 and an output of NAND circuit 324 to output signal /Q1.

Frequency divider 306 includes a 3-input NAND circuit 332 receiving signals /Q2, Q1 and ROSC, a 3-input NAND circuit 334 receiving signals Q1, Q2, and ROSC, a NAND circuit 336 receiving the output of NAND circuit 332 at one input, and a NAND circuit 338 receiving the outputs of NAND circuits 336 and 334. The output of NAND circuit 338 is applied to the other input of NAND circuit 336.

Frequency divider 306 further includes a NAND circuit 342 receiving the outputs of NAND circuit 336 and the inverter 303, a NAND circuit 344 receiving the outputs of NAND circuit 338 and inverter 303, a NAND circuit 346 receiving signal /Q2 and the output of NAND circuit 342 to output signal Q2, and a NAND circuit 348 receiving signal Q2 and the output of NAND circuit 344 to output signal /Q2.

Figure 14:
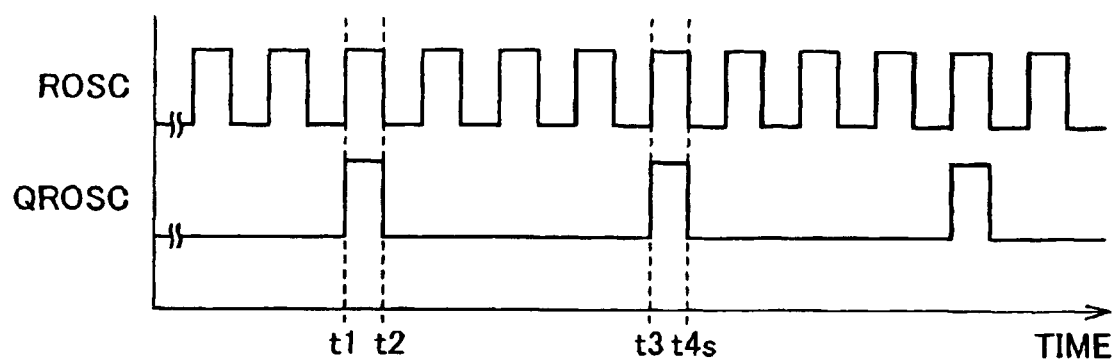
FIG. 14 is an operation waveform diagram to explain an operation of frequency divider 302 in FIG. 13.

FIG. 14 is an operation waveform diagram to explain an operation of frequency divider 302 of FIG. 13.

Referring to FIGS. 13 and 14, a pulse appears in signal QROSC at time t1, t2. The next pulse of signal QROSC appears at time t3–t4. As a result of the frequency-dividing operation, signal QROSC will have a frequency that is ¼ the frequency of signal ROSC.

Figure 15:
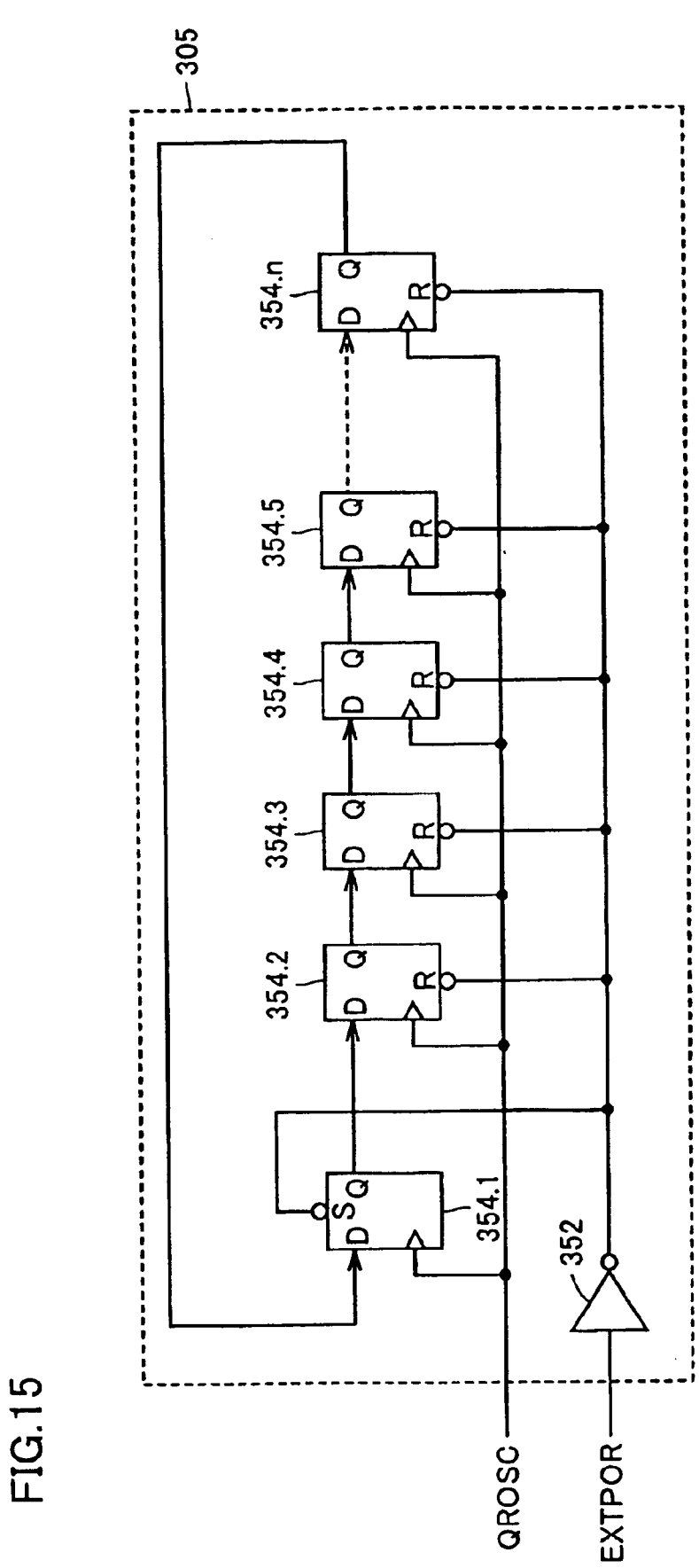
FIG. 15 is a circuit diagram of a structure of a ring counter 305 in FIG. 12.

FIG. 15 is a circuit diagram of a structure of ring counter 305 of FIG. 12.

Referring to FIG. 15, ring counter 305 includes D flip-flops 354.1–354.n connected in series, and an inverter 352 receiving and inverting reset signal EXTPOR. D flip-flops 354.1–354.n receive signal QROSC as a clock signal. The data is shifted in synchronization with this clock signal. The data shifted to D flip-flop 354.n is fed back to D flip-flop 354.1. D flip-flop 354.1 is a D flip-flop provided with setting. The data is set when the output of inverter 352 is at an L level.

D flip-flops 354.2–343.n are D flip-flops provided with resetting. The data is reset when the output of inverter 352 is at an L level.

Figure 16:
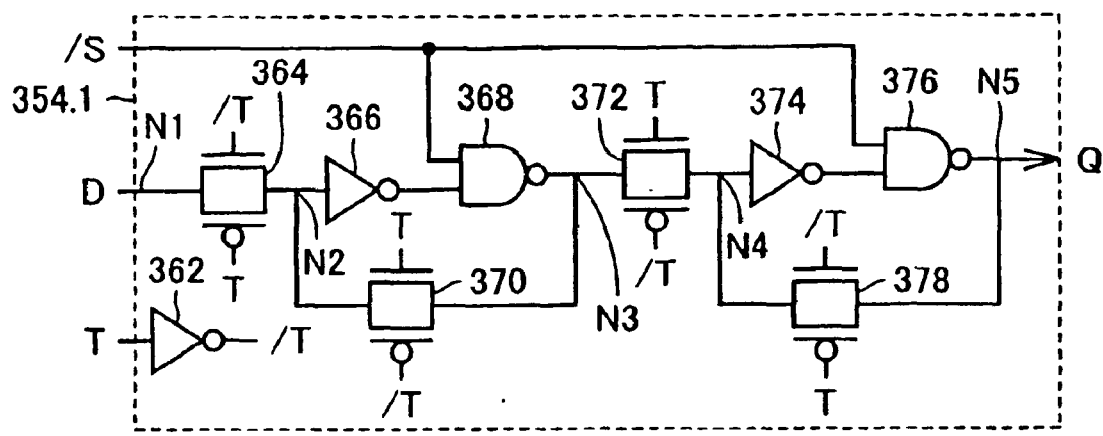
FIG. 16 is a circuit diagram of a structure of a D flip-flop 354.1 in FIG. 15.

FIG. 16 is a circuit diagram of a structure of D flip-flop 354.1 of FIG. 15.

Referring to FIG. 16, D flip-flop 354.1 includes an inverter 362 receiving and inverting clock input T to output an inverted clock /T, a transmission gate 364 connecting a node N1 to which input signal D is applied and a node N2 when inverted clock /T is active, an inverter 366 having its input connected to node N2, a NAND circuit 368 receiving a set signal /S and the output of inverter 366, and a transmission gate 370 connected between a node N3 connected to the output of NAND circuit 368 and node N2, and rendered conductive when clock input T is active.

D flip-flop 354.1 further includes a transmission gate 372 connected between nodes N3 and N4, and rendered conductive when clock input T is active, an inverter 374 having its input connected to node N4, a NAND circuit 376 receiving set input IS and the output of inverter 374 to output signal Q, and a transmission gate 378 connected between node N5 connected to the output of NAND circuit 376 and node N4, and rendered conductive when inverted clock /T is active.

Figure 17:
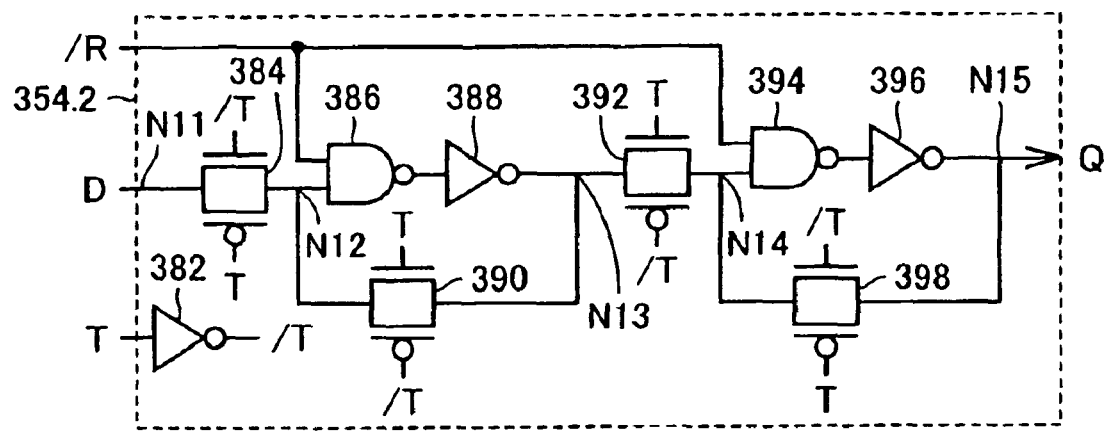
FIG. 17 is a circuit diagram of a structure of a D flip-flop 354.2.

FIG. 17 is a circuit diagram of a structure of D flip-flop 354.2.

Referring to FIG. 17, D flip-flop 354.2 includes an inverter 382 receiving and inverting a clock input T to output inverted clock /T, a transmission gate 384 connected between the node to which data input D is applied and a node N 12, and rendered conductive when inverted clock /T is active, a NAND circuit 386 having reset signal /R applied to one input and the other input connected to node N12, an inverter 388 receiving and inverting the output of NAND circuit 386, and a transmission gate 390 connected between a node N13 to which the output of inverter 388 is applied and node N12, and rendered conductive when clock input T is active.

D flip-flop 354.2 further includes a transmission gate 392 connected between nodes N13 and N14, and rendered conductive when clock input T is active, a NAND circuit 394 having one input receiving reset input /R and the other input connected to node N14, an inverter 396 receiving and inverting the output of NAND circuit 394 to provide an output Q, and a transmission gate 398 connected between a node N15 that is connected to the output of inverter 396 and node N14, and rendered conductive when inverted clock /T is active.

The structure of respective D flip-flops 354.3–354.n is similar to that of D flip-flop 354.2. Therefore, description thereof will not be repeated.

In the power-on reset circuit of the third embodiment, the count number of the counter can be set to a value other than $2^n$. Therefore, the time up to reset cancel can be adjusted minutely. By the combination of a frequency divider and ring counter, increase in the circuit area can be suppressed than in the case where the counter is formed only of a ring counter.

[Modification of Third Embodiment]

The third embodiment can be modified by using a frequency divider 302A instead of frequency divider 302 described with reference to FIG. 13.

Figure 18:
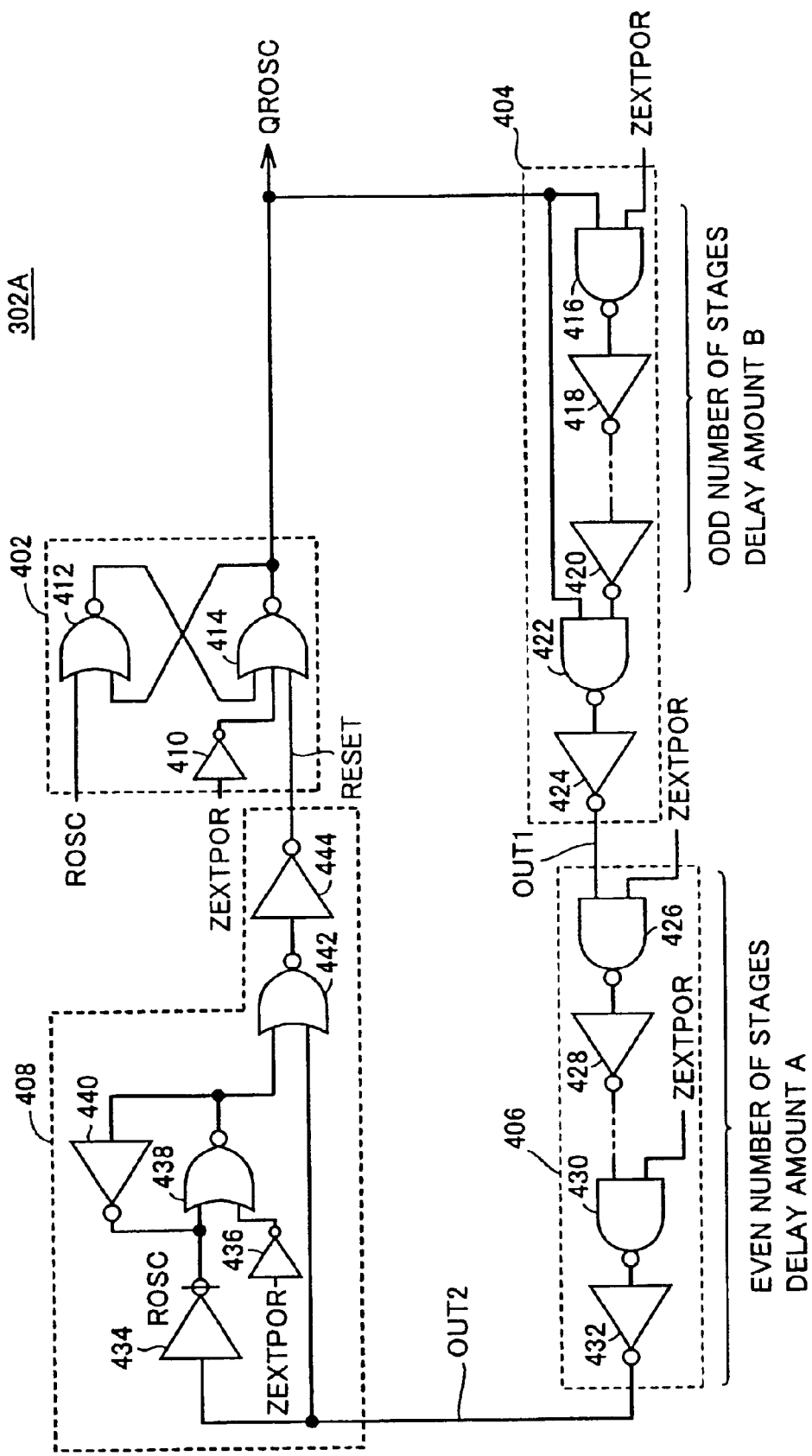
FIG. 18 is a circuit diagram of a structure of a frequency divider 302A.

FIG. 18 is a circuit diagram of a structure of frequency divider 302A.

Referring to FIG. 18, frequency divider 302A includes a latch circuit 402 having data set in response to activation of signal ROSC and reset in response to signal RESET, a pulse generation circuit 404 generating a pulse of a predetermined pulse width in response to a rise of signal QROSC output from latch circuit 402, a delay circuit 406 delaying a signal OUT1 provided from pulse generation circuit 404, and a hold circuit 408 rendering reset signal RESET active in response to a rise of a signal OUT2 provided from delay circuit 406 to hold activation of reset signal RESET until signal ROSC is rendered active after inactivation of signal OUT2 to an L level.

Latch circuit 402 includes an inverter 410 receiving and inverting a signal ZEXTPOR, an NOR circuit 412 receiving signals ROSC and QROSC, and a 3-input NOR circuit 414 receiving the output of an OR circuit 412, the output of inverter 410, and signal RESET to output signal QROSC.

Signal ZEXTPOR is an inverted version of signal EXTPOR.

Pulse generation circuit 404 includes a NAND circuit 416 receiving signals QROSC and ZEXTPOR, a plurality of inverters 418–420 connected in series, receiving the output of NAND circuit 416, a NAND circuit 422 receiving the output of inverter 420 and signal QROSC, and an inverter 424 receiving and inverting the output of NAND circuit 422 to output signal OUT1. NAND circuit 416 and inverters 418–420 correspond to a train of an odd number of inverters when signal ZEXTPOR is at an H level. This train of an odd number of stages of inverters has a delay B.

Delay circuit 406 includes a NAND circuit 426 receiving signals OUT1 and ZEXTPOR, an inverter 428 receiving and inverting the output of NAND circuit 426, a NAND circuit 430 receiving the output of inverter 428 and signal ZEXTPOR, and an inverter 432 receiving and inverting the output of NAND circuit 430 to output signal OUT2. Delay circuit 406 corresponds to a train of an even number of inverters when signal ZEXTPOR is at an H level. This train of an even number of stages of inverters has a delay A. A plurality of inverters can be inserted in series to inverter 428 in order to adjust delay A.

Hold circuit 408 includes a clocked inverter 434 receiving and inverting signal OUT in response to activation of signal ROSC, an inverter 436 receiving and inverting signal ZEXTPOR, a NOR circuit 438 receiving the outputs of clocked inverter 434 and inverter 436, an inverter 440 receiving and inverting the output of NOR circuit 438 to feed back the inverted signal to the output node of clocked inverter 434, a NOR circuit 442 receiving the output of NOR circuit 438 and signal OUT2, and an inverter 444 receiving and inverting the output of NOR circuit 442 to output signal RESET.

Figure 19:
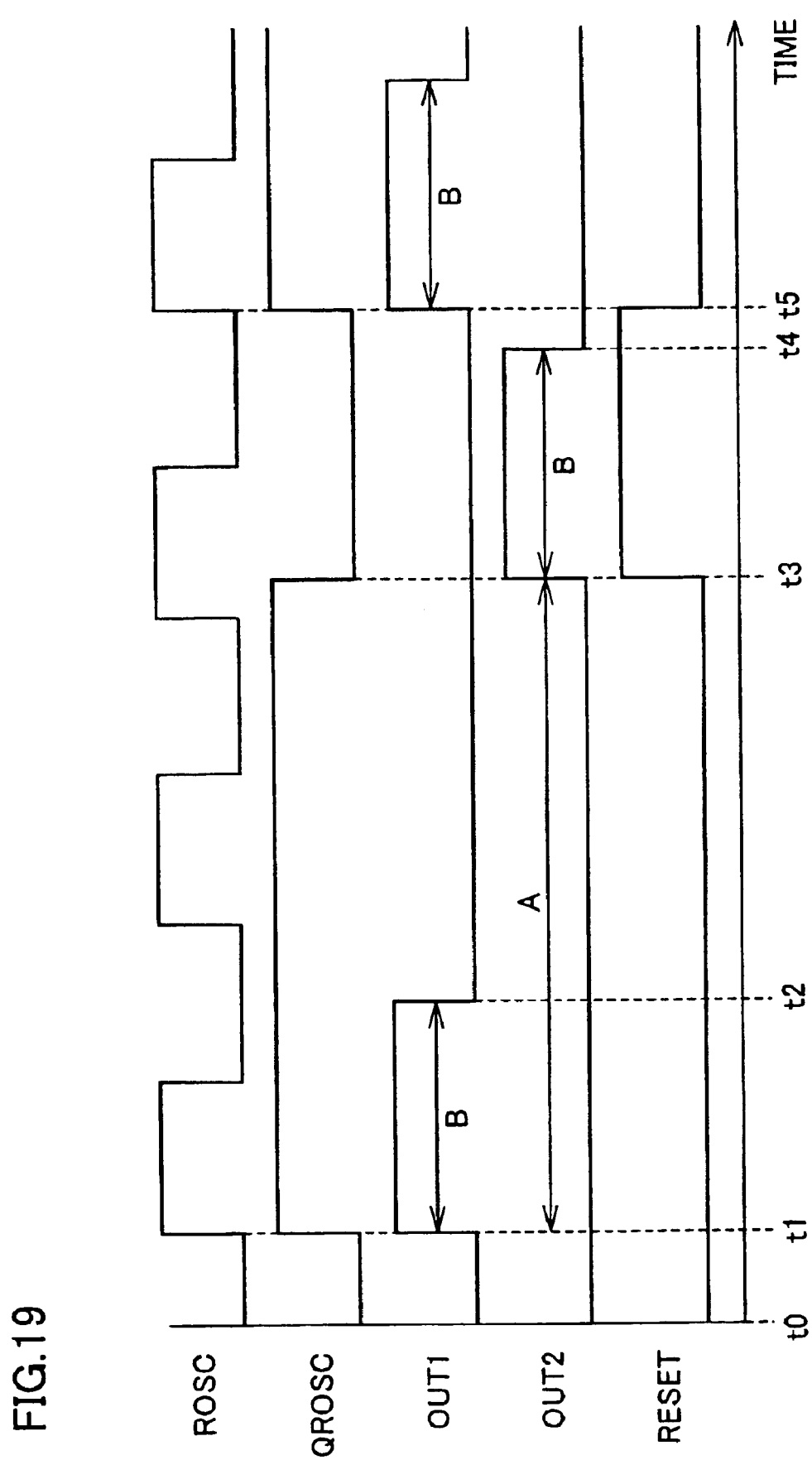
FIG. 19 is an operation waveform diagram to explain an operation of frequency divider 302A in FIG. 18.

FIG. 19 is an operation waveform diagram to explain an operation of frequency divider 302A of FIG. 18.

Referring to FIGS. 18 and 19, signal ZEXTPOR is set at an L level for initialization before time t0. Signals ROSC, QROSC, OUT1, OUT2, and RESET are all set to an L level.

When signal ROSC is pulled up to an H level from an L level at time t1, the data is set in latch circuit 402. Signal QROSC is driven to an H level from an L level. In response, pulse generation circuit 404 has its output signal OUT1 pulled up to an H level from an L level. At time t2 corresponding to the elapse of delay B from time t1, signal OUT1 is pulled down to an L level from an H level.

Since the rise of signal OUT1 at time t1 is passed through delay circuit 406, signal OUT2 from delay circuit 406 is pulled up to an H level from an L level at time t3. Time t1–t3 correspond to delay A of delay circuit 406.

When signal RESET is driven to an H level from an L level in response to the rise of signal OUT2 at time t3, latch circuit 402 is reset. Therefore, signal QROSC is pulled down to an L level from an H level.

In a similar manner, the fall of signal OUT1 at time t2 is conveyed at time t4, whereby signal OUT2 is pulled down to an L level from an H level.

Even if signal OUT2 attains an L level at time t4, signal RESET will not immediately change since hold circuit 408 is present.

At time t5, clocked inverter 434 of hold circuit 408 is rendered active in response to a rise of signal ROSC. Since signal OUT2 attaining an L level is conveyed also to OR circuit 438, signal RESET is pulled down to an L level from an H level. Then, signal QROSC is pulled up again to an H level from an L level, and the operation from time t1 to time t5 is repeated.

By the usage of frequency divider 302A of FIG. 18, the circuit area can further be reduced than in the case where frequency divider 302 of FIG. 13 is employed. There is also an advantage that the period of the frequency divider can be easily altered by adjusting the delay amounts A and B.

Fourth Embodiment

Figure 20:
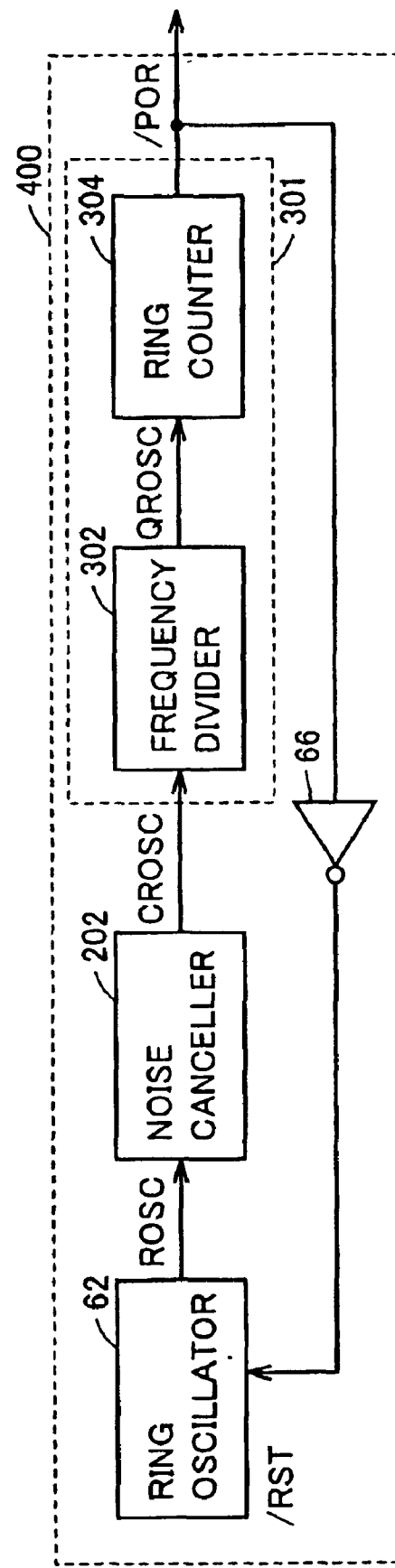
FIG. 20 is a circuit diagram of a structure of a power-on reset circuit 400 according to a fourth embodiment of the present invention.

FIG. 20 is a circuit diagram of a structure of a power-on reset circuit 400 according to a fourth embodiment of the present invention.

Referring to FIG. 20, power-on reset circuit 400 has a structure similar to that of power-on reset circuit 300 of FIG. 12. The difference is in a noise canceller 202 provided between ring oscillator 62 and counter 301. The structure of noise canceller 202 has been already described with reference to FIG. 10. Therefore, description thereof will not be repeated here.

In the case where signal ROSC generated at ring oscillator 62 is overlaid with noise of a small pulse width, a signal CROSC having the noise removed is applied to counter 301.

By using the power-on reset circuit of the fourth embodiment, erroneous operation caused by noise at the time of power on can be prevented. Also, the time up to reset cancel can be adjusted while suppressing increase of the circuit area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first power supply circuit receiving an external power supply potential to generate a first internal power supply potential; and
   a first power-on reset circuit providing a first reset signal in response to activation of said first internal power supply potential,
   said first power-on reset circuit including
      a first oscillation circuit conducting oscillation in response to activation of said first internal power supply potential, and
      a first count circuit receiving said external power supply potential as an operating power supply potential to effect a count operation in response to an output of said first oscillation circuit, and causing said first reset signal to make a transition from a reset status to a reset cancel status when a count value reaches a predetermined value.

2. The semiconductor device according to claim 1, wherein said first power-on reset circuit further includes a noise canceller circuit receiving an output of said first oscillation circuit to erase a pulse of a width smaller than a predetermined value.

3. The semiconductor device according to claim 2, wherein said noise canceller circuit includes
   a delay circuit delaying an output of said first oscillation circuit, and
   a NAND circuit receiving outputs of said first oscillation circuit and said delay circuit.

4. The semiconductor device according to claim 1, further comprising an external power-on reset circuit resetting said first count circuit in response to activation of said external power supply potential,
   wherein said first power-on reset circuit further includes an oscillation inhibit control circuit rendering an oscillation reset signal which resets said first oscillation circuit inactive and active in response to an output of said external power-on reset circuit and said first reset signal, respectively.

5. The semiconductor device according to claim 1, wherein said first count circuit includes a plurality of T flip-flops connected in series, receiving an output of said first oscillation circuit.

6. The semiconductor device according to claim 1, wherein said first count circuit includes
   a first count unit receiving an output of said first oscillation circuit to conduct a frequency-dividing operation setting a frequency of a signal to $\frac{1}{2^n}$, and
   a second count unit conducting a count operation according to an output of said first count unit.

7. The semiconductor device according to claim 6, wherein said second count unit includes a plurality of D flip-flops, connected in a loop, to perform a shift operation according to an output of said first count unit.

8. The semiconductor device according to claim 1, further comprising:
   a first internal circuit receiving said first internal power supply potential as an operating power supply potential, and reset according to said first reset signal, said first internal circuit including a memory array retaining externally applied data;
   a second power supply circuit receiving an external power supply potential to generate a second internal power supply potential;
   a second power-on reset circuit providing a second reset signal according to activation of said second internal power supply potential, said second power-on reset circuit further including
      a second oscillation circuit conducting oscillation according to activation of said second internal power supply potential, and
      a second count circuit receiving said external power supply potential as an operating power supply potential to conduct a count operation according to an output of said second oscillation circuit, and providing said second reset signal when a count value reaches a predetermined value; and
   a second internal circuit receiving said second internal power supply potential as an operating power supply potential, and reset according to said second reset signal, said second internal circuit including a control circuit receiving an externally applied control signal to provide timing control on said memory array.

* * * * *